United States Patent [19]

Miller et al.

[11] Patent Number: 5,427,886
[45] Date of Patent: Jun. 27, 1995

[54] IMAGING PROCESS

[75] Inventors: Robert E. Miller; Lowell Schleicher; Robert W. Brown; Lucy Feldman, all of Appleton, Wis.

[73] Assignee: Appleton Papers Inc., Appleton, Wis.

[21] Appl. No.: 208,395

[22] Filed: Mar. 9, 1994

Related U.S. Application Data

[63] Continuation-in-part of Ser. No. 943,090, Sep. 10, 1993, Pat. No. 5,340,680.

[51] Int. Cl.6 .................................................. G03C 1/72
[52] U.S. Cl. ..................................... 430/138; 430/332; 430/964; 430/199; 430/307; 503/201; 503/215; 347/171; 264/4.33; 264/4.7
[58] Field of Search ............... 430/138, 964, 332, 199, 430/120, 307; 503/215, 201; 346/76 R, 76 PH, 76 L; 264/4.7, 4.33

[56] References Cited

U.S. PATENT DOCUMENTS 4,753,968  6/1988  Shioi et al. .......................... 523/208
4,937,119  6/1990  Nikles et al. ........................... 428/64

Primary Examiner—Charles L. Bowers, Jr.
Assistant Examiner—John A. McPherson
Attorney, Agent, or Firm—Benjamin Mieliulis

[57] ABSTRACT

A novel imaging process is disclosed comprising preparing microcapsules having an elongation of less than 1%, adhering the microcapsules to a substrate then imagewise rupturing certain of said microcapsules upon selective application of a thermal energy input comprising a $\Delta T$ of at least 115° C. per 1 millisecond. The process makes use of novel microcapsules polymerized at a temperature of from 65° C. to 100° C. which are heat resistant yet heat fracturable upon application of a thermal pulse.

5 Claims, 1 Drawing Sheet

1

IMAGING PROCESS

This application is a continuation-in-part of Ser. No. 07/943,090 filed Sep. 10, 1993, now U.S. Pat. No. 5,340,680.

BACKGROUND OF THE INVENTION

1. Field of Invention

This invention relates to record material. It more particularly relates to image receiving sheets in the form of sheets and adhered microcapsules.

2. Description of Related Art

Record material systems are well known in the art and are described in many patents, for example, U.S. Pat. Nos. 3,539,375; 3,674,535; 3,746,675; 4,151,748; 4,181,771; 4,246,318; and 4,470,057 which are incorporated herein by reference. In thermally responsive systems, basic chromogenic material and acidic color developer material are contained in a coating on a substrate which, when heated to a suitable temperature, melts or softens to permit said materials to react, thereby producing a colored mark.

U.S. Pat. No. 4,529,681 discloses a light- and heat-sensitive record material relying on use of permeable capsules relying on heat to effect coloring component permeation through the thermoplastic capsule wall.

DETAILED DESCRIPTION

Figure 1:
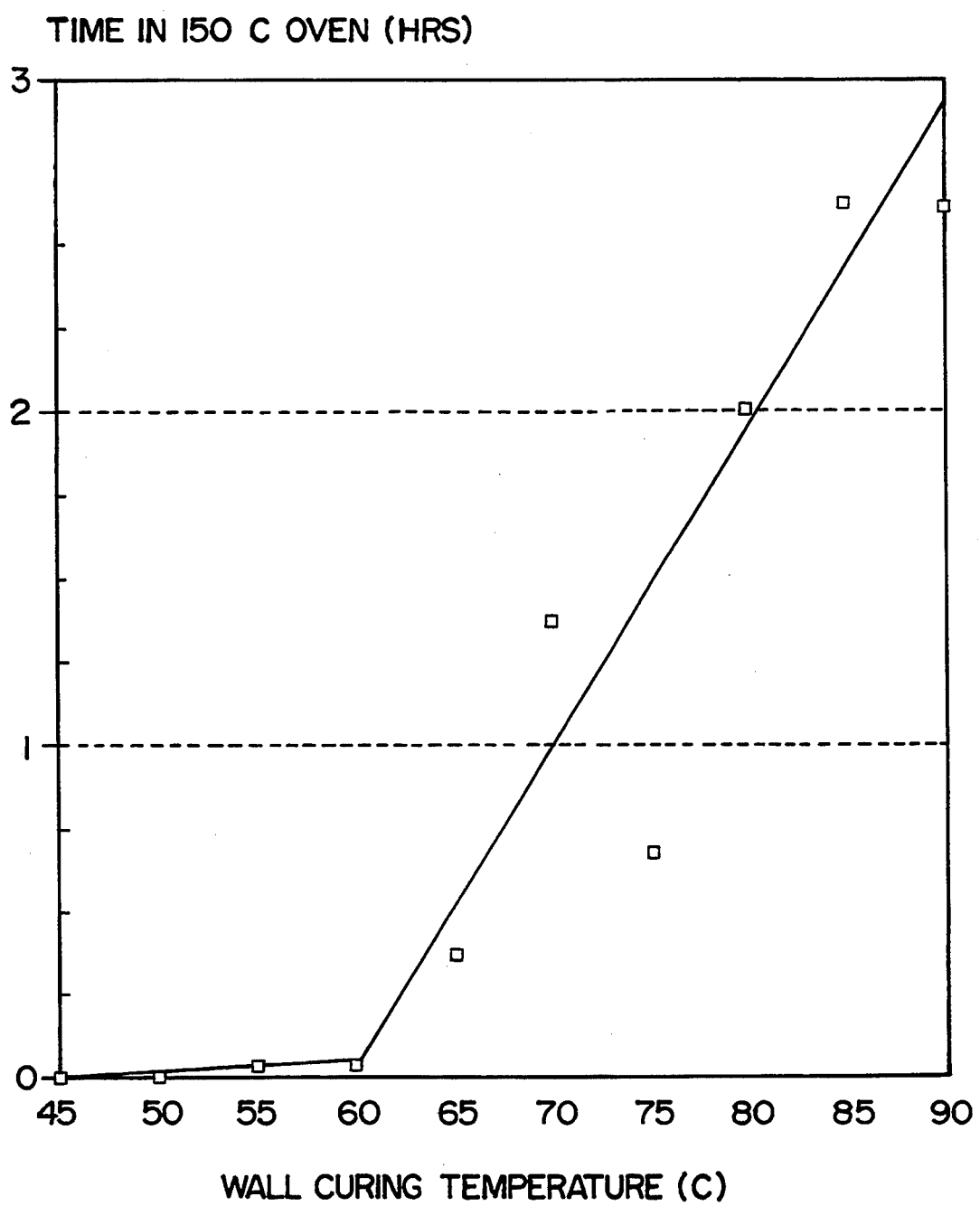
FIG. 1 is a graph of the time required to reach 10% of ultimate color density by heating in a 150° C. oven capsules polymerized at different temperatures in 5° increments.

The present invention is a process for forming an image. The process comprises preparing microcapsules in an aqueous manufacturing vehicle by enwrapping intended capsule core material comprising a chromogen and a photosensitive composition, substantially insoluble in said vehicle, with a polymeric wall material having an elongation of less than 1% produced by in situ polymerization of resins selected from the group consisting of melamine and formaldehyde, methylol melamine, and methylated methylol melamine, wherein the polymerization is conducted at a temperature of from 65° C. to 100° C. These capsules are adhered to a substrate along with an acidic developer material in substantially contiguous relationship. Adherence of the capsules to the substrate is typically provided by use of a binder material. Certain of the microcapsules are imagewise ruptured upon selective application of a thermal energy input comprising a $\Delta T$ of at least 115° C. per 1 millisecond so as to enable the chromogen to react with the acidic developer material to produce a color. The substrate with adhered capsules is exposed to actinic radiation so as to change the viscosity of the photosensitive composition, thereby deactivating the microcapsules such that substantially no further color is produced.

A variation can involve a process for forming a latent image. The process comprises preparing microcapsules in an aqueous manufacturing vehicle by enwrapping intended capsule core material, substantially insoluble in said vehicle with a polymeric wall material having an elongation of less than 1% produced by in situ polymerization of resins selected from the group consisting of melamine and formaldehyde, methylol melamine, and methylated methylol melamine, wherein the polymerization is conducted at a temperature of from 65° C. to 100° C. The microcapsules are adhered to a substrate and then certain of the microcapsules are imagewise ruptured upon selective application thereto of a thermal energy input comprising a $\Delta T$ of at least 115° C. per 1 millisecond to form a latent image. The capsule core material can be selected from the group consisting of a solvent, a hydrophilic material, and a hydrophobic material.

An image developer can be applied to the ruptured substrate with ruptured adhered microcapsules. The image developer preferentially occupies the ruptured capsules to form a visible image.

The present invention is based on a novel nonmeltable microcapsule and resulting latent image receiving sheet. This sheet with microcapsules is useful to form a variety of useful products including:

a) an ink transfer sheet or print plate.

In this embodiment, the microcapsules contain a dye, ink, pigment, or dye precursor. The latent image is recorded by means of application of a point source energy input or pulse comprising a $\Delta T$ of at least 115° C. per one millisecond. The sheet is then pressed against a second sheet resulting in transfer of a visible image corresponding to the capsules on the latent image sheet which had been ruptured by the point source energy pulse. Sublimable dyes can be used in a variation and the latent image transferred after capsule rupture by heating the latent image sheet to effect transfer of dyes to a second sheet.

b) a low cost gravure type of sheet.

In this embodiment, the microcapsules contain a low boiling or a high vapor pressure solvent, or a gas. The latent image receiving sheet when exposed to a point source energy input or pulse comprising a $\Delta T$ of at least 115° C. per one millisecond results in a sheet with a selected field of ruptured capsules. The ruptured capsules define the latent image. Over time the contents of the ruptured capsules evaporate, leaving a low cost gravure type of sheet. An ink can be squeegeed over the sheet to fill the voids created by the ruptured capsules. A second sheet can then be pressed against the latent image receiving sheet to effect transfer of an image corresponding to the ruptured capsules.

c) a cryptic message receiving sheet.

In this embodiment, the microcapsules, similar to b) above, contain a low boiling or high vapor pressure solvent, or a gas. The latent image receiving sheet when exposed to a point source energy input or pulse comprising a $\Delta T$ of at least 115° C. per one millisecond results in a sheet with a selected field of ruptured capsules. As in b) above, this selected field constitutes a latent image in that selection can be in a predetermined pattern. The image can be developed by application of toner fine particles, such as xerographic toners, onto the sheet. These will preferentially adhere to the ruptured capsule sites.

d) an imageable sheet.

In this embodiment, the microcapsules contain one of either a chromogen or developer. The latent image receiving sheet when exposed to a point source energy input or pulse comprising $\Delta T$ of at least 115° C. per one millisecond results in a sheet with a selected field or pattern of ruptured capsules. The ruptured capsules define a latent image. The image can be made visible by application to the latent image receiving sheet of a solvent or dispersion containing the second component of chromogen or developer, whichever was omitted from the capsule contents.

The invention will now be more fully described with a particular focus on the () novel capsules of the invention.

The latent image receiving sheet of the invention comprises a substrate bearing microcapsules having walls selected from non-meltable or thermoset resin. The walls of the microcapsules are selected to have an elongation not more than 1%. Surprisingly, the non-meltable walls of the microcapsules rupture upon application thereto of a point source energy input comprising a $\Delta T$ of at least 115° C. per one millisecond.

The latent image receiving sheet has adhered microcapsules having walls of thermosetting or non-meltable resin with critically an elongation of not more than 1%. The thermosetting resin is preferably selected from methylated methylol melamine, or selected from combinations of melamine and formaldehyde, or methylol melamine polymerized at a temperature of from 65° C. to 100° C. Table 1 lists elongations of a variety of resins. The microcapsule walls are nonmeltable.

Exposure of the latent image receiving sheet to a thermal energy input comprising a $\Delta T$ ("change in temperature") of at least 115° C. per one millisecond ruptures the capsules and this is theorized to occur due to induced or produced stresses.

The microcapsules can contain any core material conventionally used in microencapsulation. These can include various combinations of a solvent, a hydrophobic or hydrophilic material, liquid preferably hydrophobic liquid, gas, developer or chromogen, inks, dyes, toners, or pigments.

The novel sheet with microcapsules of the invention has a variety of new uses. Upon exposure of the sheet with microcapsules to a thermal energy input comprising a $\Delta T$ ("change in temperature") of at least 115° C. per one millisecond, the microcapsules rupture.

A thermal energy input typically is a thermal print head. It is readily apparent and understood that such thermal energy input devices can include a rapidly heating block or multiplicity of thermal print heads assembled as a larger unit. A thermal energy input for purposes of the invention can take the form of a thermal print head, laser, focussed hot jets, heated stylus and the like. The ability to effect a change in temperature of at least 115° C. per one millisecond at the receiving sheers surface is needed to effect the unusual shattering of the non-meltable capsules of the invention. Shattering is believed attributable to induced or produced thermal stresses though the invention disclosed herein should not be construed as limited to this one underlying theory, as other mechanisms may also be operating.

Upon application of the appropriate $\Delta T$ to the sheet in a selective pattern, a latent image is recorded on the sheet by virtue of rupture of the microcapsules, which one can think of in terms of an assembly of sealed bottles, some of which, however, are selectively shattered so that they have open tops, thus becoming open containers. An appropriate developer material can be applied across the surface of the sheet by conventional applicator means such as sponging, spraying, cotton swab or other applicator to develop the image. Alternatively, if a hydrophobic material is placed in the capsule, a hydrophobic ink or dye applied across the surface of the sheet will, preferentially, adhere to the hydrophobic material resulting in an image.

The capsules of the latent image receiving sheet, unlike the prior art, do not melt or become porous, but rather fracture from the rapid change in temperature or energy input.

If the microcapsules are constructed such as to encapsulate a hydrophobic material, then after recording a latent image on the receiving sheet with a thermal print head, a hydrophobic ink can be applied across the surface of the sheet, and it will preferentially occupy the capsules with shattered tops exposing hydrophobic material when the freely applied hydrophobic ink is squeegeed or wiped away from the surface of the sheet. Conversely, hydrophilic materials can be encapsulated for use with hydrophilic inks. The result is a low-cost gravure type of print plate or transfer sheet. Alternatively, ink or dye can be encapsulated in the capsules to also create a similar transfer sheet.

If use as a print plate is contemplated, then the substrate is typically selected of more rigid stock or even synthetic material for better durability.

The latent image receiving sheet can be used as optical recording medium, such as for recording of digitized information by laser or thermal print head.

The latent image receiving sheet also finds use for transfer of information in latent form. Being created by a thermal print head, transmission of cryptic messages is made possible. The latent image can be subsequently developed as herein earlier described.

The capsules of the receiving sheet, unlike the prior art, do not melt or become porous upon energy input, but rather fracture from the rapid change in temperature or energy input such as an energy pulse. Exposure of the receiving sheet to an energy input, such as with a thermal print head, or other source capable of generating the appropriate $\Delta T$ shatters the microcapsules and encodes the latent image.

The capsules of the record material, unlike the prior art, do not melt upon energy input, but rather appear to rupture from rapid change in temperature or energy input. Significantly this gives rise to a novel material which is heat resistant. Surprisingly the latent image receiving sheet of the invention can be placed in a hot oven (150° C.) for substantial time periods such as one minute and the capsules do not become permeable. Conventional thermal paper by contrast images in an oven almost instantaneously.

The insulating characteristics of the wall material and the absence of heat dissipation via phase change appears to lead to a high concentration of energy at the contact area between the point source and the capsule.

The elongation value for the wall material of the microcapsules can be taken from tables for various resins. The published values correlated well with the observed phenomena and provide a convenient means to select appropriate resins. Resins having elongation values of not more than 1% selected to be used as wall material result in microcapsules with nonmeltable polymeric shells or wall material displaying the unusual characteristics of shattering attributable to induced thermal stresses.

Table 1 summarizes elongation values for a variety of resin materials.

TABLE 1

| Resin | Elongation (%) |
| --- | --- |
| acetal | 60–75 |
| acrylic | 20–50 |
| cellulose | 5–100 |

TABLE 1-continued

| Resin | Elongation (%) |
|---|---|
| fluorcarb | 80–400 |
| ionomers | 100–600 |
| polyamides | 25–300 |
| polycarbonates | 60–100 |
| polyethylenes | 5–900 |
| polypropylenes | 3–700 |
| polystyrenes | 1–140 |
| vinyls | 2–400 |
| epoxies | 1–70 |
| phenolics | 1–2 |
| phenol formaldehyde | 0.4–2 |
| melamine formaldehyde | 0.6–1.0 |
| polyester | 40–300 |
| polyester alkyd | 0.5–2 |
| silicone | 100 |
| urea formaldehyde | 0.5 |
| urethane | 300–1000 |
| nylon | 300 |

The elongation of the polymeric shells or wall is determined for purposes of the invention, from the elongation (%) value of the bulk resins when polymerized and using standards tests such as ASTM test method D638.

More conveniently, tables of elongation (%) values for a variety of resins are available from a variety of sources including pages 532 to 537 of *Principles of Polymer Systems*, 2nd Edition by Ferdinand Rodriguez of Cornell University, published by Hemisphere Publishing Corporation (1970). The elongation values for the bulk material correlated well as a surprising predictor of resins functional in the invention.

Instead of melting, becoming plasticized with other melted materials, or increasing in permeability due to a phase transformation, the wall of the capsules of the invention appears to rupture. Failure of the capsule wall appears attributed to a high temperature gradient and nonsteady state of heat transfer. Such conditions create localized thermal stresses. The magnitude of the stress depends on the properties of the material. A brittle wall can sustain less strain and thus ruptures.

Elongation properties appear to correlate well with wall brittleness and facilitate selection of resin.

The capsules of the invention surprisingly fracture upon application of a point source energy input comprising a change in temperature ($\Delta T$) of at least 115° C. per one millisecond.

$\Delta T$ can be calculated according to the formula $$S = E\alpha(T - T_0)$$

S refers to stress
E is modulus of elasticity
$\alpha$ is coefficient of linear thermal expansion $\Delta T$ is $T - T_0$ in the above formula. S which is stress ranges for melamine formaldehyde polymers from $5 \times 10^3$ psi to $13 \times 10^3$ psi and for phenol formaldehyde polymers ranges from about $5 \times 10^3$ psi to about $9 \times 10^3$ psi. To calculate the lower practical point source energy input S is taken as $(5 \times 10^3)$ psi. The modulus of elasticity ranges from about $(11 \times 10^5)$ to $(14 \times 10^5)$ psi. On the lower range thus, E is taken as $11 \times 10^5$. The coefficient of linear thermal expansion is $(4 \times 10^{-5})$° C.

Therefore, $5 \times 10^3 = (11 \times 10^{-5})(4 \times 10^{-5})(T - T_0)$
$(T - T_0) = \Delta T = 113.6°$ or about 115° C. per one millisecond.

By this method the calculated threshold $\Delta T$ is about 115° C.

A second method of arriving at $\Delta T$ is by way of the data derived from Example 1. Example 1 demonstrates that the temperature at the record system surface when using a conventional fax such as a Canon Fax 230 is greater than 170° C. This is the temperature that the surface of the paper or media sees. The temperature of the thermal print head is higher, but the temperature observed at the surface of the media is alone relevant as regards the thermal stresses to which the capsules on the surface of the paper are subjected.

Room temperature is approximately 25° C. and thus should be subtracted from the temperature measured, 170° C. − 25° C. = 145° C. Based on the quantity of dye present, $\Delta T$ to effect fracture was calculated as approximately at least 115° C. per one millisecond but preferably 145° C. per one millisecond.

Since the capsules are nonmeltable or thermoset in character, there is no latent heat capacity and substantially no phase change.

In the examples, the record system when subjected to a thermal print head, resulted in ruptured capsules observed with a scanning electron microscope.

The capsule core material can include inks, dyes, toners, chromogens, solvents, gases, liquids, and pigments. The capsule core material is relatively independently selected. The core can be any material which is substantially water insoluble. Extensive lists of other core materials are listed in U.S. Pat. No. 4,001,140 incorporated herein by reference. The core material can be any material dispersible in water and wrappable by the wall material. This can include air. As a more specific description of a useful core material, an imaging material such as chromogen, dye, toner, or pigment and the like can be prepositioned in the microcapsules as the core material. The core can be selected to be colorless electron donating compounds, dye precursor or chromogens which form color by reacting with a developer material. Representative examples of such compounds include substantially colorless compounds having a lactone, a lactam, a sulfone, a spiropyran, an ester or an amido structure in their partial skeleton such as triarylmethane compounds, bisphenylmethane compounds, xanthene compounds, fluorans, thiazine compounds, spiropyran compounds and the like.

Eligible electron donating dye precursors which are chromogenic compounds, such as the phthalide, leucauramine and fluoran compounds, for use in the color-forming system are well known. Examples of the chromogens include Crystal Violet Lactone (3,3-bis(4-dimethylaminophenyl)-6-dimethylaminophthalide, U.S. Pat. No. Re. 23,024); phenyl-, indol-, pyrrol-. and carbazol-substituted phthalides (for example, in U.S. Pat. Nos. 3,491,111; 3,491,112; 3,491,116; 3,509,174); nitro-, amino-, amido-, sulfon amido-, aminobenzylidene-, halo-, anilino-substituted fluorans (for example, in U.S. Pat. Nos. 3,624,107, 3,627,787, 3,641,011; 3,642,828; 3,681,390); spiro-dipyrans (U.S. Pat. No. 3,971,808); and pyridine and pyrazine compounds (for example, in U.S. Pat. Nos. 3,775,424 and 3,853,869). Other specifically eligible chromogenic compounds, not limiting the invention in any way, are: 3-diethylamino-6-methyl-7-anilino-fluoran (U.S. Pat. No. 3,681,390); 2-anilino-3-methyl-6-dibutylaminofluoran (U.S. Pat. No. 4,510,513) also known as 3-dibutylamino-6-methyl-7-anilinofluoran; 3-dibutylamino-7-(2-chloroanilino) fluoran; 3-(N-ethyl-N-tetrahydrofurfurylamino)-6-methyl-7-3-5'6-tris(di-methylamino)spiro[9H-fluroene-9'1(3'H)-isobenzofuran]-3'-one; 7-(1-ethyl-2-methylindol-3-yl)-7-(4-diethylamino-2-ethoxyphenyl)-5,7-dihydrofuro[3,4-b]pyridin-5-one (U.S. Pat. No. 4,246,318); 3-diethylamino-7-(2-chloroanilino)fluoran (U.S. Pat. No. 3,920,510); 3-(N-methylcyclohexylamino)-6-methyl-7-anilino-fluoran (U.S. Pat. No. 3,959,571); 7-(1-octyl-2-methylindol-3-yl)-7-(4-diethylamino-2-ethoxyphenyl)-5,7-dihydrofuro[3,4-b]pyridin-5-one; 3-diethylamino-7, 8-benzofluoran; 3, 3-bis(1-ethyl-2-methylindol-3-yl) phthalide; 3-diethylamino-7-anilinofluoran; 3-diethylamino-7-benzylamino-fluoran; 3'-phenyl-7-dibenzylamino-2,2'-spiro-di-[2H-1-benzo-pyran] and mixtures of any of the following.

The components of the color-forming system including capsules are in substantially contiguous relationship, substantially homogeneously distributed throughout the coated layer material deposited on the substrate. The term substantially contiguous is understood to mean that the color-forming components are positioned in sufficient proximity such that upon melting, softening or subliming one or more of the components, a reactive color forming contact between the components is achieved. As is readily apparent to the person of ordinary skill in this art, these reactive components accordingly can be in the same coated layer or layers, isolated or positioned in separate layers. In other words, one component can be positioned in the first layer, and reactive or sensitizer components positioned in a subsequent layer or layers. All such arrangements are understood herein as being substantially contiguous.

Solvents such as the following can optionally be included in the microcapsules:

1. Dialkyl phthalates in which the alkyl groups thereof have from 4 to 13 carbon atoms, e.g., dibutyl phthalate, dioctylphthalate, dinonyl phthalate and ditridecyl phthalate
2. 2,2,4-trimethyl-1,3-pentanediol diisobutyrate (U.S. Pat. No. 4,027,065)
3. ethyldiphenylmethane (U.S. Pat. No. 3,996,405)
4. alkyl biphenyls such as monoisopropylbiphenyl (U.S. Pat. No. 3,627,581)
5. $C_{10}$–$C_4$ alkyl benzenes such as dodecyl benzene
6. diaryl ethers, di(aralkyl)ethers and aryl aralkyl ethers, ethers such as diphenyl ether, dibenzyl ether and phenyl benzyl ether
7. liquid higher dialkyl ethers (having at least 8 carbon atoms)
8. liquid higher alkyl ketones (having at least 9 carbon atoms)
9. alkyl or aralkyl benzoates, e.g., benzyl benzoate
10. alkylated naphthalenes
11. partially hydrogenated terphenyls The solvent, if included, can be selected to facilitate dissolving the dye mixture, if included. If the capsules include chromogens, the latent image of the receiving sheet can be made visible by various conventional acidic developer materials preferably as dispersions or solutions applied to the latent image receiving sheet following application of the latent image. Other variations can include prepositioning the acidic developer material in substantially contiguous relationship to the chromogen material. Developer can be positioned in the capsules and chromogen applied following rupture, or alternatively, chromogen can be positioned in the capsules.

Examples of eligible acidic developer material include: clays, treated clays (U.S. Pat. Nos. 3,622,364 and 3,753,761); aromatic carboxylic acids such as salicylic acid; derivatives of aromatic carboxylic acids and metal salts thereof (U.S. Pat. No., 4,022,936); phenolic developers (U.S. Pat. Nos. 3,244,550 and 4,573,063); acidic polymeric material such as phenol-formaldehyde polymers, etc. (U.S. Pat. Nos. 3,455,721 and 3,672,935); and metal-modified phenolic resins (U.S. Pat. Nos. 3,732,120; 3,737,410; 4,165,102; 4,165,103; 4,166,644 and 4,188,456).

Processes of microencapsulation are now well known in the art. U.S. Pat. No. 2,730,456 describes a method for capsule formation. Other useful methods for microcapsule manufacture are U.S. Pat. Nos. 4,001,140; 4,081,376 and 4,089,802 describing a reaction between urea and formaldehyde; U.S. Pat. No. 4,100,103 describing reaction between melamine and formaldehyde; British Patent No. 2,062,750 describing a process for producing microcapsules having walls produced by polymerization of melamine and formaldehyde in the presence of a styrenesulfonic acid. The more preferred processes, in this invention, for forming microcapsules are from melamine formaldehyde resins as disclosed in U.S. Pat. Nos. 4,001,140; 4,089,802; 4,100,103; 4,105,823; or 4,552,811. The process of U.S. Pat. No. 4,552,811 is preferred. These patents are incorporated herein by specific reference.

The record material includes a substrate or support material which is generally in sheet form. For purposes of this invention, sheets can be referred to as support members and are understood to also mean webs, rolls, ribbons, tapes, belts, films, cards and the like. Sheets denote articles having two large surface dimensions and a comparatively small thickness dimension. The substrate or support material can be opaque, transparent or translucent and could, itself, be colored or not. The material can be fibrous including, for example, paper and filamentous synthetic materials. It can be a film including, for example, cellophane and synthetic polymeric sheets cast, extruded or otherwise formed.

Binder material can be included to assist adherence of the capsules to the substrate and can include materials such as polyvinyl alcohol, hydroxy ethylcellulose, methylcellulose, methyl-hydroxypropylcellulose, starch, modified starches, gelatin and the like. Latex such as polyacrylate, styrene-butadiene, rubber latex, polyvinylacetate and polystyrene can also be advantageously used.

The examples which follow are given to illustrate the invention and should not be considered as limiting. In the examples all parts or proportions are by weight and all measurements are in the metric system, unless otherwise stated.

The principles, preferred embodiments, and modes of operation of the present invention have been described in the foregoing specification. The invention which is intended to be protected herein, however, is not to be construed as limited to the particular forms disclosed, since these are to be regarded as illustrative rather that restrictive. Variations and changes can be made by those skilled in the art without departing from the spirit and scope of the invention.

EXAMPLE 1

Ascertaining Media Surface Temperature Using Fax Machine

Coatings of color former dispersion were prepared on a thin translucent paper substrate. Segments of the coatings were taped to a sheet of bond paper and used as the copy sheet in a Canon Fax-230. Melting was readily evident as clear (amorphous) characters on a relatively opaque background. Using this technique, the temperature at the surface of the media or sample was determined to be at least above 170° C. with a Canon Fax-230.

| Color Former | Melting Temp. + | Melt in Fax? |
|---|---|---|
| diButyl N102 | ~170° C. | Yes |
| PSD-150 | ~200° C. | No |
| Green 118 | ~230° C. | No |

+ As determined using the grinds on Kofler Hot Bar

EXAMPLE 2

Microcapsule Preparation

Internal Phase (IP)

| | | |
|---|---|---|
| 20 g | N102, 3-diethylamino-6-methyl-7-anilino fluoran | |
| 180 g | trimethylolpropane triacrylate (TMPTA) monomer | |
| 2 g | 2-isopropyl thioxanthone | Photo Initiator |
| 2 g | ethyl-4-dimethylamino benzoate | Photo Initiator |
| 24 g | 2,2-dimethoxy-2-phenyl acetophenone | Photo Initiator |

Combine the first two components and dissolve with heat, then dissolve the photo initiators.

External Phase (EP)

| | |
|---|---|
| 25 g | Colloid 351 (~25% solids) Acrylic polymer, Rhone-Poulenc (butyl acrylate) |
| 198 g | Water |
| | Adjust pH to 5.0 using 20% NAOH. |

Emulsification

Place 170 g of EP in blender and with mild agitation add the IP solution. Increase the blender speed to achieve desired drop size (eg., 50% of volume approximately 4.0μ) measured by Microtrac particle size analyzer from Leeds and Northrup Instruments, North Wales, Pa. 19454.

Encapsulation

Combine the following:

| | |
|---|---|
| 25 g | Colloid 351 (~25% Solids) |
| 42 g | Water pH adjusted to 4.8 with 20% NAOH |
| 30 g | Cymel* 385 (~80% solids) |

Add 70 g of the above to the emulsion and transfer to a vessel in a water bath. With stirring, heat the emulsion to 65° C. and allow to process several hours for encapsulation to occur.

*Cymel is a trade mark of American Cyanamid Company. Cymel 385 is an etherified methylol melamine oligomer.

Coating

Combine equal weight parts of:
1. Finished capsule dispersion
2. 10% aqueous solution of Airvol 103

This mixture is applied to paper or other desired substrate using, for example, a fixed gap applicator set a 0.001 inch. The resultant dried coating can be used to make a latent copy in a thermal printer such as a commercial facsimile machine.

The latent image copy can be developed by contacting with or applying on an appropriate developer for the N102 color former. A typical example would be a 20% solution of Durez #27691 (p-phenylphenol formaldehyde resin) in xylene. The resin can also be applied in aqueous dispersion or emulsion form and then heated to promote the development of the black copy.

If desired, the resultant copy may be "fixed" or deactivated to thermal and/or pressure response by exposing to U.V. to polymerize the components. Approximately 5 second exposure to 15 Watt GE Bulbs (F15T8-BLB) is sufficient to "fix" the copy. After fixing, the sheet is resistant to scuff or abrasive induced markings.

Because of the reactive nature of the coating prior to fixing, the coating can suffer handling damage. This damage can be reduced by applying an overcoat that does not interfere with the thermal imaging nor with the subsequent fixing exposure. A typical overcoat would be the application of a 10% aqueous solution of Airvol* 540 using a #3 wire wound rod.

*Airvol is a trade mark of Air Products and Chemicals, Inc. and is a polyvinyl alcohol.

The photoinitiators can be omitted in the capsules of the latent image receiving sheet. Chromogen can be optionally included or excluded as desired.

EXAMPLE 3

DRY DEVELOPMENT a. Two sheets were prepared:
  microcapsule formulation of Example 2 was coated on one sheet
  color developer formulation was coated on another.
b. The capsule containing sheet was imaged with a thermal print head.
c. The imaged capsule sheet was coupled face-to-face with a color developer sheet. The developer sheet is a sheet coated with a phenolic resin dispersion Durez 32421 phenolic resin dispersion (~50% solids) benzoic acid, 2-hydroxy polymer, with formaldehyde, nonylphenol and zinc oxide. Both sheets coupled together were sent between two fusing rolls heated to 110° C.
d. The substrate of the color developer sheet was peeled off. It revealed a fully developed image remaining on the imaging sheet.

EXAMPLE 4

INTERNAL PHASE (IP)

160 g TMPTA 40 g Durez 27691 (p-phenylphenol formaldehyde resin)

12 g 2,2-dimethoxy-2-phenylacetophenone (photoinitiator)

With heating, dissolve the resin in the TMPTA, then add the photoinitiator and dissolve. This IP was encapsulated as in Example 2 and resultant capsule dispersion coated and top coated. The coated media was run through a commercial facsimile to produce an image. This image was developed by application of a commercial toner such as Minolta MT Toner II. The black toner particles selectively adhere to the image-wise broken capsules. Toner in the background was removed by gentle brushing, etc. The toner is fused by heating in an oven or on a heated drum or the like.

EXAMPLE 5

Same as Example 4, but imaging with FAX and toner application steps were repeated to add second color. Multicolor images can be obtained using repetition of the process.

EXAMPLE 6

PLAIN PAPER/TRANSFER IMAGE

Plastic sheet imaged with toner (as in Example 3 or 4) was coupled with bond paper, and both sheets were sent together between two fusing rolls heated to 90° C.

b. Plastic sheet was removed.

c. Transfer image was obtained on plain paper.

EXAMPLE 7

IMAGING WITH TONERS a. Melamine formaldehyde (MF) microcapsules containing sec-butyl biphenyl solvent (SureSol 290) only were prepared according to the invention.

b. Imaging sheet was made by coating microcapsules on a plastic sheet and applying PVA overcoat.

c. Latent image was produced using Canon 230 FAX machine in a copy mode.

d. Portion of the sample was placed into a container with a commercial toner (electrostatic copier toner).

e. The container was tightly closed and shaked to deposit toner on the sample surface.

f. After excess toner was removed from sample using brush, red image on white background was obtained.

EXAMPLE 8

IMAGING WITH THERMAL TRANSFER RIBBON a. Microcapsule latent imaging sheet, which did not contain dye, or color developer was used.

b. A latent image was recorded onto the sheet using a Canon 230 facsimile machine.

c. The imaged sheet with selectively broken capsules or latent image was brought into the contact with the coated side of a thermal transfer ribbon and sent through heated fusing rolls.

d, When plastic of thermal transfer ribbon was removed, a colored image on the microcapsule imaging sheet was obtained.

EXAMPLE 9

TRANSFER SHEETS a. A latent image was recorded onto a sheet containing empty or solvent—only microcapsules using a Canon 230 facsimile machine.

b. Blue color ink was evenly distributed on the surface of the above sheet.

c. The excess ink was removed by pressing inked imaging sheet against smooth clay coated paper.

d. Inked surface of above sheet was positioned on top of plain paper sheet and sent through a steel pressure rolls nip. (Applied pressure=170 pli). Blue high contrast print was obtained on paper. pli=-pounds per lineal inch.

e. In a variation, black commercial printing press ink was used. Excess ink was removed from the sample using blade-like tool. After the transfer to paper, black print on clean white background was obtained.

EXAMPLE 10

TRANSFER SHEET

Internal Phase (IP)

180 g trimethylolpropanetriacrylate (TMPTA) monomer 20 g 1,3,3-trimethylindolino-6'-chloro-8'methoxybenzopyrylospiran 12 g 2,2-dimethoxy-2-phenylacetophenone (photoinitiator)

Combine components and dissolve with heat. This IP was encapsulated as in Example 1 and resultant capsule dispersion applied to suitable substrate using a #12 wire wound rod. The coating was dried and top coated with a 10% aqueous solution of Airvol 540 using a #3 wire wound rod. The coated media was run through a commercial facsimile to produce a master image. When the master image was heated in contact with a developer sheet, a copy was obtained due to sublimation of the spiran from the image-wise broken capsules. The imaged master could be used multiple times to make additional copies. Imaged copies are obtained on a commercially available carbonless CF sheet such as comprised of a p-phenylphenol formaldehyde type resin.

EXAMPLE 11

I had melamine-based capsules prepared as follows:

| Internal Phase (IP): | 668.0 g | sec-butylbiphenyl (U.S. Pat. No. 4,287,074) |
| --- | --- | --- |
|  | 545.0 g | $C_{11}$–$C_{15}$ aliphatic hydrocarbon |
| Heat to dissolve | 55.0 g | 3-diethylamino-6-methyl-7-(2',4''-dimethyl anilino)-fluoran |
|  | 6.5 g | Crystal Violet Lactone |
|  | 6.1 g | I-6B (3,3-bis-(indol-3yl-phthalide) (CIBA-GEIGY) |
| External Phase: | 125.0 g | Colloid 351 (25%) |
|  | 990.0 g | water |
|  | Adjust to pH 5.0 w/20% NAOH |  |

Emulsification:
Cool IP to ~70° C. and add to external phase at ambient temperature in blender. Using speed control, emulsify to 50% volume size of 4–4.5 u (Microtrac particle size analyzer).
Encapsulation: Split emulsion into separate portions of ~475 g and add to each:

| 25.0 g | Colloid 351 (25%) |
| --- | --- |
| 42.0 g | Water pH adjusted to 4.7 w/20% NAOH |
| 30.0 g | Resimene AQ7550 (80%) methylated melamine formaldehyde resin (Monsanto) |
| 3.5 g | $Na_2SO_4$ may optionally be added to control viscosity) |

Each separate portion was placed in bath at a different temperature in 5° C. increments, specifically 45°, 50° C., 55° C., 60° C., 65° C., 70° C., 75° C., 80° C., 85° C., 90° C. and allowed to stir for ~16 hrs.

The batches were combined with coreactant:

| 15.0 g | Capsule batch |
| --- | --- |
| 10.0 g | 10% Airvol 103 |
| 10.0 g | Durez 32421 |

The capsules were coated independently onto a substrate and then each set of capsules produced at different encapsulation temperatures were placed into a 150° C. oven.

The time it took to form a color ($D_t$) equal to 10% of the maximum achievable color ($D_{ult}$) was graphed, with the ordinate being the temperature of encapsulation and the abscissa being the time to reach a $D_t/D_{ult}$ of 10%. Color density increase in % of ultimate density obtained with heat was determined with the use of a MacBeth densitometer. The graph is shown in FIG. 1. An unexpected discontinuity is observed starting with capsules prepared by encapsulation at about 65° C.

What we claim is:

1. A process for forming a latent image, said process comprising
    preparing microcapsules in an aqueous manufacturing vehicle by enwrapping intended capsule core material, substantially insoluble in said vehicle with a polymeric wall material having an elongation of less than 1% produced by in situ polymerization of resins selected from the group consisting of melamine and formaldehyde, methylol melamine, and methylated methylol melamine, wherein the polymerization is conducted at a temperature of from 65° C. to 100° C.;
    adhering said microcapsules to a substrate;
    imagewise rupturing certain of said microcapsules upon selective application thereto of a thermal energy input comprising a $\Delta T$ of at least 115° C. per 1 millisecond to form a latent image.

2. The process according to claim 1 wherein the capsule core material is selected from the group consisting of a solvent, a hydrophilic material, and a hydrophobic material.

3. A process for forming an image, said process comprising
    preparing microcapsules in an aqueous manufacturing vehicle by enwrapping intended capsule core material, substantially insoluble in said vehicle with a polymeric wall material having an elongation of less than 1% produced by in situ polymerization of resins selected from the group consisting of melamine and formaldehyde, methylol melamine, and methylated methylol melamine, wherein the polymerization is conducted at a temperature of from 65° C. to 100° C.;
    adhering said microcapsules to a substrate;
    rupturing certain of said microcapsules upon selective application thereto of a thermal energy input comprising a $\Delta T$ Of at least 115° C. per 1 millisecond to form a latent image;
    applying an image developer to said substrate with adhered microcapsules, said image developer preferentially occupying said ruptured capsules to form an image.

4. The process according to claim 3 wherein the developer is selected from toner, ink, or pigment.

5. The process according to claim 3 wherein the capsule core material is a chromogen and the image developer is an election donating material for imparting color to said chromogen.

* * * * *